(12) United States Patent
Hynes

(10) Patent No.: US 6,518,818 B1
(45) Date of Patent: Feb. 11, 2003

(54) HIGH VOLTAGE CMOS OUTPUT DRIVER IN LOW VOLTAGE PROCESS

(75) Inventor: Owen J. Hynes, Otsego, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/954,251

(22) Filed: Sep. 17, 2001

(51) Int. Cl.[7] .................................................. H03L 5/00
(52) U.S. Cl. ......................... 327/333; 327/112; 326/81
(58) Field of Search ................................ 327/108, 112, 327/333, 427, 59, 60, 437; 326/68, 81, 83, 87

(56) References Cited

U.S. PATENT DOCUMENTS

| | | | | |
|---|---|---|---|---|
| 5,729,155 A | * | 3/1998 | Kobatake | 326/68 |
| 5,973,508 A | * | 10/1999 | Nowak et al. | 326/81 |
| 6,040,729 A | * | 3/2000 | Sanchez et al. | 327/108 |
| 6,064,227 A | * | 5/2000 | Saito | 326/68 |

* cited by examiner

Primary Examiner—Terry D. Cunningham
Assistant Examiner—Long Nguyen
(74) Attorney, Agent, or Firm—Dennis C. Bremer

(57) ABSTRACT

A high-voltage output buffer is implemented in a low-voltage semiconductor process. The buffer comprises a level translator circuit, the level translator operable to receive a signal varying between ground and a low voltage level, and to output a corresponding signal varying between a reference voltage level and a high voltage level. The reference voltage level is an intermediate voltage level between half of the low voltage level and the high voltage level. The buffer further comprises an output circuit operable to receive via an input the output of the level translator circuit, and to output a high voltage level when the input is a high voltage level or a zero voltage level when the input is at the reference voltage level.

16 Claims, 2 Drawing Sheets

HIGH VOLTAGE CMOS OUTPUT DRIVER IN LOW VOLTAGE PROCESS

FIELD OF THE INVENTION

The invention relates generally to semiconductor circuitry, and more specifically to a high voltage CMOS output driver in a low voltage semiconductor process.

BACKGROUND OF THE INVENTION

While semiconductor circuitry such as bipolar and CMOS circuitry has traditionally operated at a five volt potential difference between a high and a low signal level, the need for higher speed, lower power consumption, and lower heat dissipation has prompted a move to lower voltage circuitry. It is now common for such semiconductors to operate at voltage levels of 3.3 or 2.5 volts, allowing fabrication of such higher performance semiconductor devices.

Although such devices are capable of a higher level of performance in many respects than older five volt semiconductors, they often must be integrated into designs or products utilizing the older five volt technology and so must be designed to interface with such circuitry. These lower voltage semiconductors are often designed to receive either a five volt signal or a lower voltage signal in the same device, making integration into older systems relatively easy where the newer low voltage semiconductors must receive signals.

But, these lower voltage semiconductors cannot provide a five volt output signal as easily as the can receive one. Because the fabrication processes used in these lower voltage semiconductors comprise standard transistor geometries designed to conduct only lower voltages, they are not physically capable of reliably providing a full five volt output signal.

What is desired is a high voltage output driver capable of providing a high voltage output signal in a low voltage process semiconductor.

SUMMARY OF THE INVENTION

The invention described here provides a high-voltage output buffer implemented in a low-voltage semiconductor process, enabling low-voltage semiconductors to interface with high-voltage circuitry. The buffer comprises a level translator circuit that in operation receives a signal varying between ground and a low voltage level, and outputs a corresponding signal varying between a reference voltage level and a high voltage level. The reference voltage level is an intermediate voltage level between half of the low voltage level and the high voltage level. The buffer also comprises an output circuit that in operation receives the output of the level translator circuit, and outputs a corresponding high voltage level when the input is a high voltage level or a zero voltage level when the input is at the reference voltage level. The low voltage supply in some embodiments of the invention is derived from the greater of an external low voltage supply or the reference voltage derived from the high voltage supply, so that the transistors of the buffer are protected from high voltages in the event of an external low voltage supply failure.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides a high voltage output driver capable of providing a high voltage output signal in a low voltage process semiconductor. The output buffer of one embodiment of the invention does this by use of a level translator circuit and an output circuit, examples of which are described in greater detail herein.

Figure 1:
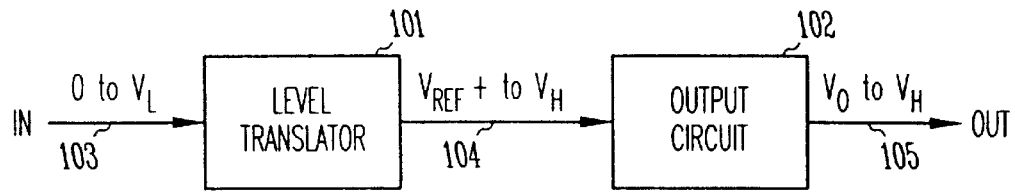
FIG. 1 shows a block diagram of an output buffer circuit, consistent with an embodiment of the present invention.

FIG. 1 illustrates one such embodiment of an output buffer having a level translator stage 101 and an output circuit 102. The level translator circuit receives an input signal 103 varying between a ground or zero volt level and the low voltage Vl that is the voltage level at which the semiconductor process used to fabricate the circuit is designed to operate. The level translator circuit 101 translates the received voltage signal 103 and outputs at 104 a signal varying between a reference voltage Vref and a high voltage level Vh. That is, when the level translator receives a ground or zero input voltage it outputs a high voltage level Vh, and when the translator receives a low voltage level Vl it outputs the reference voltage level Vref. The reference voltage Vref is in some embodiments of the invention an intermediate voltage selected to be approximately half way between the low voltage level Vl and ground. In application, the Vref voltage signal output by the level translator may be somewhat higher than Vref, such as Vref plus the threshold voltage of a certain transistor. This will be explained in greater detail in other example embodiments of the invention.

Next, an output circuit 102 receives the signal 104 which varies between approximately Vref to Vh, and translates it to an output signal 105 ranging between ground or V0 and Vh. When the output circuit receives a signal at level Vref it outputs a signal Vh, and when the circuit receives a signal at Vh it outputs a signal V0.

When the level translator and the output circuit are taken in combination to form a complete output buffer circuit, the output buffer circuit therefore will output a voltage level V0 at 105 when a V0 voltage level is received at the input 103, and will output a high voltage level Vh at 105 when a low voltage level Vl is received at 103.

The invention is operable to output a voltage level at a single output 105 that ranges across a broader range of voltage (V0 to Vh) than the semiconductor design process permits to be applied across any single transistor because of the unique structure of the output buffer circuit.

Figure 2:
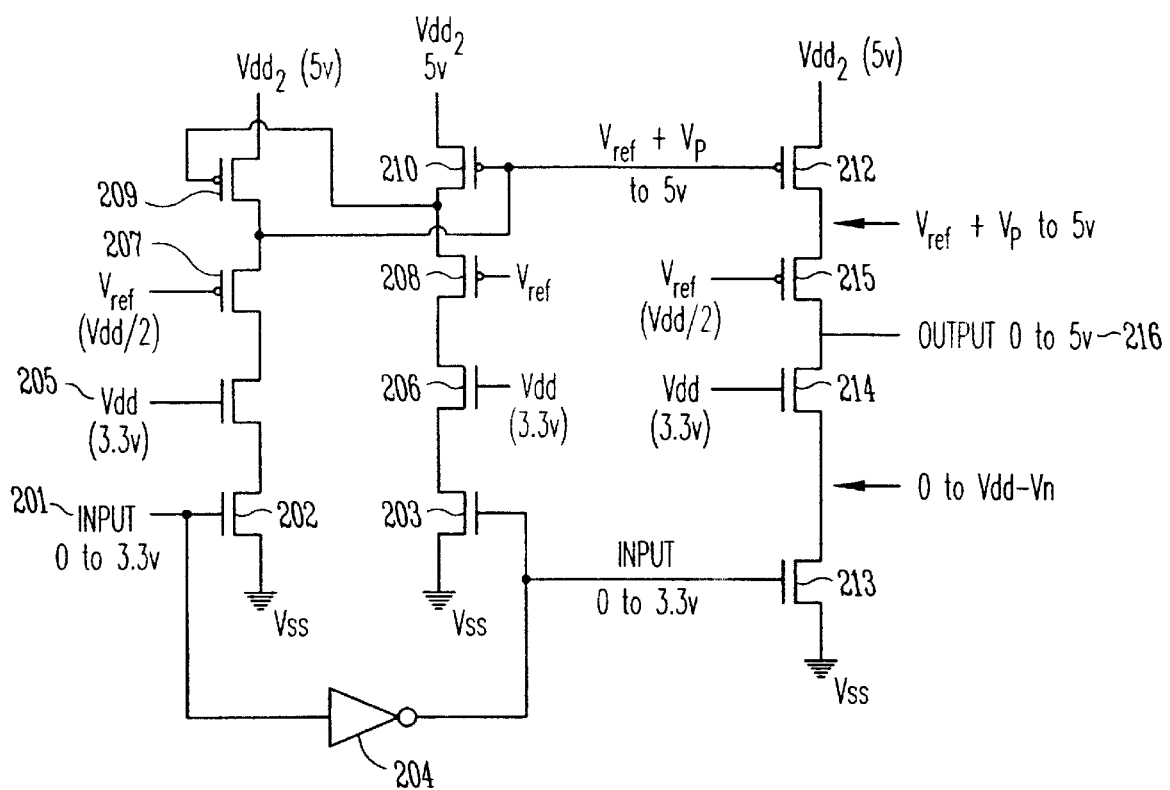
FIG. 2 shows a five-volt output buffer circuit, consistent with an embodiment of the present invention.

A detailed view of an embodiment of the output buffer circuit showing individual transistors is shown in FIG. 2, demonstrating how the present invention may be constructed to avoid applying a greater voltage than Vl across any transistor of the buffer circuit. In this example, Vl is 3.3 v, which indicates that the circuits are built using a 3.3 v semiconductor fabrication process. The supply voltage Vdd is therefore also 3.3 volts, supplying the circuit with the traditional operating voltage as a power source.

Vref is defined for this example as Vdd/2, and so is therefore approximately 1.66 volts. Vdd2 is the high voltage level, which in this example embodiment of the invention is a 5 volt power source.

The input is received at 201, which ranges from zero or ground (Vss) to Vl, which is 3.3 volts in this example. The input signal is received by the gates of complementary n-channel transistors 202 and 203, where the signal provided to transistor 203 is first inverted by inverter 204. The voltage level Vdd, here 3.3 volts, is supplied to the gates of n-channel transistors 205 and 206, and the reference voltage of Vdd2/3 or approximately 1.66 volts is applied to the gates of p-channel transistors 207 and 208. P-channel transistors 209 and 210 are connected to the voltage source Vdd2 of 5 volts, and are coupled between the p-channel transistors of the complementary side of the transistor ladders that comprise the level translator as shown.

In operation, either the transistor 202 or 203 will be switched on, and conduct. For purposes of this example assume a low voltage level at the input, so that transistor 203 conducts and transistor 202 does not. This results in the connection between transistors 203 and 206 being brought to ground level. Transistors 206 conducts due to the voltage Vdd applied at the gate, and similarly brings the connection between the transistor 208 and 206 to the voltage level Vss, or ground. Transistor 208 is connected to Vref at its gate, which causes it to conduct and to bring the connection between transistor 208 and 210 to approximately Vref plus the threshold voltage of the PMOS transistor. Because the threshold voltage in this example is approximately 0.85 volts and Vref is approximately 1.65 volts, this connection is brought to a voltage level of approximately 2.5 volts.

The connection between transistors 208 and 210 is cross-linked to the gate of transistor 209, and is sufficient to turn transistor 209 on as its drain is connected to a five volt source. The connection between transistors 209 and 207 is therefore brought to five volts, and the connection 211 between the level translator and output stages of the circuit is at a five volt level.

The output stage receives the five volt input at transistor 212, which also has its drain connected to five volts, and so remains off. Transistor 213 receives a 3.3 volt signal from the inverter 204, and so is on. The connection between transistor 213 and 214 is therefore brought to ground, and the voltage Vdd applied to transistor 214 similarly conducts the output 216 to ground. Because transistor 212 is off, it does not matter for purposes of determining the output signal whether transistor 215 conducts or does not conduct in this particular example.

But, the junction between transistors 212 and 215 is intentionally controlled in the example circuit of the present invention, to ensure that neither transistor realizes a voltage drop of greater than 3.3 volts across its source and drain. Because transistor 212 is connected at the gate to Vref plus the PMOS threshold voltage Vp, the connection between 212 and 215 is brought to Vref+Vp. Transistor 215 is on because Vref is applied to its gate, but conducts current only from its own capacitance as transistor 212 is off. This controls the voltage drop across both transistors 212 and 215, ensuring that the drop from 5 volts at Vdd2 to zero volts at the output 216 is shared between these two transistors.

If the input applied at 201 is high instead of low, transistors 202, 205, and 207 conduct, and the connection between transistors 207 and 209 is brought to Vref plus the PMOS transistor threshold voltage. This signal is conducted to the level translator output 211, turning on output circuit transistor 212 because it is significantly lower than the drain voltage Vdd2. Transistor 213 is off because its input provided by inverter 204 is low, and transistor 215 is on because its gate is connected to Vref, which is below the five volt drain voltage it sees from conducting transistor 212. The output 216 is therefore connected to Vdd2 via transistors 212 and 215, and provides an output signal of five volts. Transistor 214 is on, bringing the voltage between transistors 213 and 214 to Vdd minus the NMOS threshold voltage Vn, ensuring that the voltage drop between the 5 v output at 216 and Vss is shared between transistors 213 and 214. Again, no single transistor is subject to a drain-to-source voltage of greater than 3.3 volts, making fabrication of the circuit using a 3.3 volt semiconductor process viable.

Figure 3:
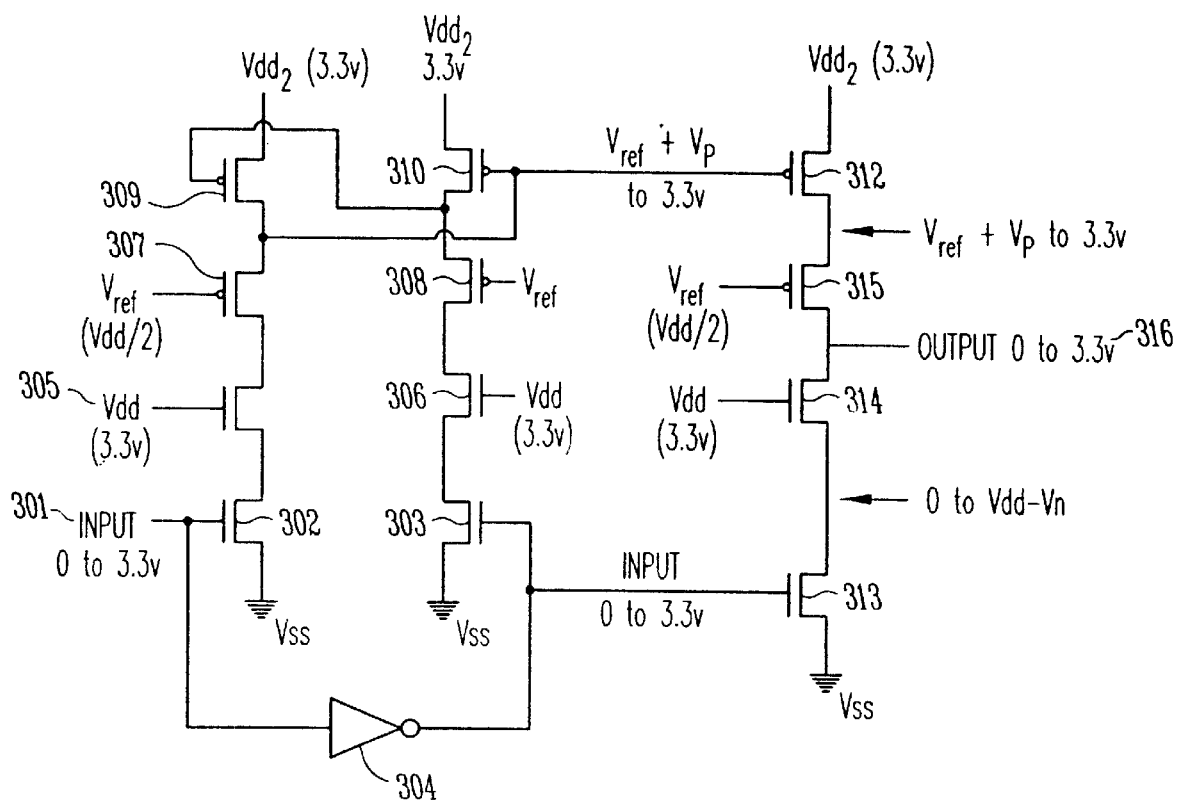
FIG. 3 shows an adaptation of the five-volt output buffer circuit of FIG. 1 to a lower voltage output, consistent with an embodiment of the present invention.

In a further embodiment of the invention, the dual power Vdd and Vdd2 signals supplied to the circuit of FIG. 2 may be both brought to 3.3 volts, in which case the same circuit may be used as a 3.3 volt output buffer. FIG. 3 illustrates how tracing through the same circuit as illustrated in FIG. 2 but with the supply voltage Vdd2 changed to 3.3 volts and the reference voltage Vref changed to 0 volts yields a 3.3 volt buffer. This enables using the same circuit to provide either 3.3 v or 5 v output signals, changing only the supply voltage Vdd2.

In FIG. 3, the numbering has been kept consistent with the numbering of FIG. 2 for easy reference. Because Vdd2 is reduced to 3.3 volts, Vref no longer needs to be derived as an intermediate voltage to limit the maximum voltage drop across a single transistor. It is therefore set to zero volts, and the circuit functions in the same way as the circuit of FIG. 2 but with an output signal of 0 to 3.3 volts.

Because the invention will in many embodiments operate within an integrated circuit fabricated in a low voltage process but having both low and high voltage power connections, it is desirable to ensure that the transistors of the circuit illustrated in FIG. 2 do not fail if the low voltage power supply fails but the high voltage power supply is operational. In such a case, five volts may be applied at Vdd2, but Vdd will be zero volts, causing transistors such as 214 to potentially see a drain to source voltage of nearly five volts in operation.

To address this, some embodiments of the invention implement a circuit or method that provides as Vdd inputs to transistors such as 214 the greater voltage level of either the low voltage supply or Vref, where Vref is derived from the high voltage supply. Such a system can be easily implemented onto the integrated circuit die, and effectively allows the integrated circuit to function without suffering damage should the low voltage supply fail or be disconnected.

The invention described here provides a high-voltage output buffer implemented in a low-voltage semiconductor process, enabling low-voltage semiconductors to interface with high-voltage circuitry. The buffer comprises a level translator circuit that in operation receives a signal varying between ground and a low voltage level, and outputs a corresponding signal varying between a reference voltage level and a high voltage level. The reference voltage level is an intermediate voltage level between half of the low voltage level and the high voltage level. The buffer also comprises an output circuit that in operation receives the output of the level translator circuit, and outputs a corresponding high voltage level when the input is a high voltage level or a zero voltage level when the input is at the reference voltage level. The low voltage supply in some embodiments of the invention is derived from the greater of an external low voltage supply or the reference voltage derived from the high voltage supply, so that the transistors of the buffer are protected from high voltages in the event of an external low voltage supply failure.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A high-voltage output buffer implemented in a low-voltage semiconductor process, comprising:
    a level translator circuit, the level translator operable to receive a signal varying between ground and a low voltage level, and to output a corresponding signal varying between a high voltage level when the received signal is ground and a reference voltage level when the received signal is the low voltage level, where the reference voltage level is an intermediate voltage level between half of the low voltage level and the high voltage level;
    an output circuit, the output circuit operable to receive via an input the output of the level translator circuit, and to output the high voltage level when the input is the reference voltage level or ground when the input is at the high voltage level; and
    a power circuit operable to supply the ground voltage level that is the greater of either a low voltage supply voltage or the reference voltage level, where the reference voltage is supplied from a high voltage supply.

2. The high-voltage output buffer of claim 1, wherein the high voltage level is five volts and the low voltage level is 3.3 volts.

3. The high-voltage output buffer of claim 1, wherein the low-voltage semiconductor process is a 3.3 volt semiconductor process.

4. The high-voltage output buffer of claim 1, wherein the buffer is further operable as a low-voltage buffer when the high voltage level supplied is approximately the same as the low voltage level.

5. A high-voltage output buffer implemented in a low-voltage semiconductor process, comprising:
    a level translator circuit, the level translator operable to receive a circuit input signal varying between ground and a low voltage level, and to output a corresponding signal varying between a high voltage level when the received input signal is ground and a reference voltage level when the received input signal is the low voltage level, where the reference voltage level is an intermediate voltage level between half of the low voltage level and the high voltage level;
    a power circuit operable to supply the low voltage level that is the greater of either a low voltage supply voltage or a reference voltage supply voltage, where the reference voltage supply voltage is derived from a high voltage supply; and
    an output circuit comprising:
        a first PMOS transistor coupled between the high voltage and a second PMOS transistor, the gate of the first PMOS transistor coupled to the output of the level translator circuit;
        a second PMOS transistor coupled between the first PMOS transistor and a first NMOS transistor, the gate of the second PMOS transistor coupled to receive the reference voltage level;
        a first NMOS transistor coupled between the second PMOS transistor and a second NMOS transistor, the gate of the first NMOS transistor coupled to receive the low voltage level;
        a second NMOS transistor coupled between the first NMOS transistor and ground, the gate of the second NMOS transistor connected to receive the level translator circuit input; and
        an output coupled to the connection between the second PMOS transistor and the first NMOS transistor.

6. The high voltage output buffer of claim 5, wherein the high voltage level is five volts and the low voltage level is 3.3 volts.

7. The high voltage output buffer of claim 5, wherein the low-voltage semiconductor process is a 3.3 volt process.

8. The high voltage output buffer of claim 5, wherein the buffer is further operable as a low-voltage buffer when the high voltage level supplied is approximately the same as the low voltage level.

9. A high-voltage output buffer implemented in a low-voltage semiconductor process, comprising:
    a power circuit operable to supply a low voltage level that is the greater of either a low voltage supply voltage or a reference voltage level, where the reference voltage is supplied from a high voltage supply;
    a first PMOS transistor,
    a second PMOS transistor, the first PMOS transistor connected between a high voltage level and the second PMOS transistor, the gate of the second PMOS transistor coupled to the reference voltage level; where the reference voltage level is approximately half of the low voltage level;
    a first NMOS transistor, the gate of the first NMOS transistor coupled to the low voltage level;
    a second NMOS transistor coupled between the first NMOS transistor and ground; the gate of the second NMOS transistor coupled to receive an input, the first NMOS transistor coupled between the second PMOS transistor and the second NOMS transistor;
    a third PMOS transistor, the gate of the third PMOS transistor coupled to the connection between the first PMOS transistor and the second PMOS transistor;
    a fourth PMOS transistor, the gate of the fourth PMOS transistor coupled to the reference voltage level, the third PMOS transistor coupled between the fourth PMOS transistor and the high voltage level, the connection between the third PMOS transistor and the fourth PMOS transistor further coupled to the gate of the first PMOS transistor;
    a third NMOS transistor, the gate of the third NMOS transistor coupled to the low voltage level;
    a fourth NMOS transistor coupled between the third NMOS transistor and ground, the gate of the fourth NMOS transistor coupled to receive an inverted input signal, and the third NMOS transistor coupled between the fourth NMOS transistor and the fourth PMOS transistor;
    a fifth PMOS transistor, the gate of the fifth PMOS transistor coupled to the connection between the first PMOS transistor and the second PMOS transistor;

a sixth PMOS transistor, the gate of the sixth PMOS transistor coupled to receive the reference voltage level, the fifth PMOS transistor coupled between the high voltage level and the sixth PMOS transistor;

a fifth NMOS transistor, the gate of the fifth NMOS transistor coupled to receive the low voltage level;

a sixth NMOS transistor coupled between the fifth NMOS transistor and ground, the gate of the sixth NMOS transistor connected to receive the inverted input signal, the fifth NMOS transistor coupled between the sixth PMOS transistor and the sixth NMOS transistor; and an output coupled to the connection between the sixth PMOS transistor and the fifth NMOS transistor.

10. The output buffer of claim 9, wherein the semiconductor process is a 3.3 volt semiconductor process.

11. The high-voltage output buffer of claim 9, wherein the high voltage level is five volts and the low voltage level is 3.3 volts.

12. The high-voltage output buffer of claim 9, wherein the buffer is further operable as a low-voltage buffer when the high voltage level supplied is approximately the same as the low voltage level.

13. A method of providing a high-voltage output from a circuit implemented in a low-voltage semiconductor process, comprising:

receiving in a level translator circuit a signal varying between ground and a low voltage level;

outputting from the level translator circuit a corresponding signal varying between a high voltage level when received signal is the ground and a reference voltage level when the received signal is the low voltage level, where the reference voltage level is an intermediate voltage level between half of the low voltage level and the high voltage level;

receiving in an output circuit the output of the level translator circuit;

outputting from the output circuit the high voltage level when the output circuit input is the reference voltage level or ground when the input is at the high voltage level; and supplying from a power circuit the low voltage level that is the greater of either a low voltage supply voltage or the reference voltage level, where the reference voltage level is derived from a high voltage supply.

14. The method of claim 13, wherein the high voltage level is five volts and the low voltage level is 3.3 volts.

15. The method of claim 13, wherein the low-voltage semiconductor process is a 3.3 volt semiconductor process.

16. The method of claim 13, wherein the method is further operable as a low-voltage buffer when the high voltage level supplied is approximately the same as the low voltage level.

* * * * *

UNITED STATES PATENT AND TRADEMARK OFFICE
CERTIFICATE OF CORRECTION

PATENT NO. : 6,518,818 B1
DATED : February 11, 2003
INVENTOR(S) : Owen J. Hynes

It is certified that error appears in the above-identified patent and that said Letters Patent is hereby corrected as shown below:

Column 5,
Line 32, delete "the" before "high" and insert -- a -- therefor.
Line 32, delete "the" before "reference" and insert -- a -- therefor.

Column 6,
Line 46, delete "NOMS" and insert -- NMOS -- therefor.

Column 8,
Line 3, delete "the" before "ground" and insert -- a -- therefor.
Line 11, delete "the" before "high" and insert -- a -- therefor.
Line 12, delete "the" before "reference" and insert -- a -- therefor.
Line 13, delete "ground" and insert -- a zero voltage level -- therefor.
Line 16, delete "the" before "low" and insert -- a -- therefor.

Signed and Sealed this

Twenty-sixth Day of August, 2003

JAMES E. ROGAN
*Director of the United States Patent and Trademark Office*